United States Patent [19]

Sherman

[11] Patent Number: 5,107,140
[45] Date of Patent: Apr. 21, 1992

[54] ANTICIPATORY AUTOMATIC GAIN CONTROL CIRCUIT

[75] Inventor: David M. Sherman, Everett, Wash.

[73] Assignee: Intermec Corporation, Lynnwood, Wash.

[21] Appl. No.: 430,502

[22] Filed: Oct. 31, 1989

[51] Int. Cl.5 .......................... H03K 5/08; H03K 5/02; H03G 3/30
[52] U.S. Cl. ..................... 307/358; 307/264; 307/493; 307/494; 307/555; 330/85; 330/136; 330/279
[58] Field of Search ........................ 235/462, 466, 436; 369/44.35, 44.36; 307/264, 358, 494, 493, 555; 330/85, 279, 136

[56] References Cited

U.S. PATENT DOCUMENTS

| | | |
|---|---|---|
| 3,849,632 | 11/1974 | Eckert, Jr. et al. . |
| 3,918,003 | 11/1975 | Seidel ................................. 330/279 |
| 3,949,233 | 4/1976 | Gluck . |
| 3,999,133 | 12/1976 | Lee et al. . |
| 4,086,476 | 4/1978 | King . |
| 4,114,030 | 9/1978 | Nojiri et al. . |
| 4,219,152 | 8/1980 | Couch et al. . |
| 4,335,301 | 6/1982 | Palmer et al. . |
| 4,517,455 | 5/1985 | Benitez, III et al. . |
| 4,528,444 | 7/1985 | Hara et al. . |
| 4,740,675 | 4/1988 | Brosnan et al. . |
| 4,818,856 | 4/1989 | Matsushima et al. . |
| 4,947,133 | 8/1990 | Thomas ................................. 307/264 |

Primary Examiner—John Zazworsky
Attorney, Agent, or Firm—Seed and Berry

[57] ABSTRACT

An apparatus for automatically adjusting the gain of amplifiers receiving the detected light signal from a bar code scanner. The apparatus causes all signals input to the signal processing circuitry to have the same gain. The anticipatory automatic gain control circuit determines the gain from a maximization of the amplitude of an input signal and a time-delayed copy of the input signal. The gain control signal thus developed is used to identically control the gains of both a first variable-gain amplifier circuit which receives the maximized amplitude signal and a second variable-gain amplifier circuit which receives only the time-delayed copy of the input signal.

5 Claims, 3 Drawing Sheets

ANTICIPATORY AUTOMATIC GAIN CONTROL CIRCUIT

DESCRIPTION

1. Technical Field

This invention relates to an automatic gain control circuit and, more particularly, to an anticipatory automatic gain control circuit for use with a bar code scanner.

2. Background Art

A bar code reader typically uses a beam of light to read a bar code, which consists of alternating strips ("bars") of differing reflectivities. The scanner then receives and interprets the fluctuations in the returning light that are caused by the bar code. It is known in the prior art to read bar codes by means of a hand-held wand which makes contact with the surface on which the bar code is printed. However, the need to make contact with the surface is frequently inconvenient and gives uninterpretable readings because the wand is not moved across the bar code with a sufficiently uniform velocity.

An alternative to a hand-held wand is a bar code scanner which does not require physical contact with the bar code which is to be read. A bar code scanner typically produces a beam of light which is repetitively scanned across an area. In laser scanners, the beam of light can be produced by a laser source, such as a laser diode. If the beam of light intercepts a bar code (or some other symbology), the modulated light which is reflected by the bar code is returned to sensing circuitry in the bar code scanner for interpretation. The strength of the modulated light signal is a function of the reflectances of the bars and spaces in the bar code, and the distance between the scanner and the bar code.

Because the distance between the scanner and the bar code can vary widely, the intensity of the received signal also varies widely. Nearly all laser scanners incorporate circuitry which converts the received signal into a digital pulse train (the wave shaper). This circuitry requires a signal of well controlled amplitude. These laser scanners also incorporate circuitry to either adjust the level of the signal to fit the wave shaper automatic gain control (AGC), or adjust the operation of the wave shaper to fit the signal (adaptive wave shaping).

The received signal is analyzed on the basis of relative time. That is, the widths of the alternating areas of different reflectivity are measured on the basis of their relative scanning times. This allows the reader to be used with bar codes which have a wide variety of sizes, the important factor being that the relative widths of the elements of the bar codes be preserved. Accordingly, it is preferable that the light beam be scanned across the bar code at a substantially uniform rate in order to ease the task of interpreting the bar code.

The design of an AGC circuit for a laser scanner is complicated by several conflicting requirements. The gain must be adjusted to maintain a constant output signal level independent of the input signal level. However, if the gain is set too high when no bar code signal is present, noise from various sources will be amplified to the point that it will produce a random output signal. The circuitry of the scanner will be forced to try to decode this random output signal, making the laser scanner slower in interpreting bar codes. Furthermore, scanners require a "quiet zone" on either side of the bar code. If the gain stays at its maximum through the quiet zone and up to the start of the bar code, noise in the quiet zone may cause spurious digital output pulses which obscure the beginning of the bar code. This problem requires that the maximum available gain be limited to a value which will prevent noise from being detected by the wave shaper.

There is another problem which is less easily solved. When the laser beam is scanning across blank paper, the signal level is low, and hence the gain of the AGC circuit is at its maximum. When the beam reaches the bar code, the signal level is large, but the AGC gain is still large as well, causing the AGC output signal to be overamplified and distorted.

To avoid this, the AGC circuit must respond extremely rapidly to any change in its input signal. That, however, causes the AGC circuit to track every variation in the input signal. This results in a gain control signal which varies as rapidly as the input signal, causing severe distortion. To avoid such distortion, while maintaining the fast response to the start of the bar code, it is necessary to make the AGC time constant highly asymmetrical. The AGC circuit must respond instantaneously to an increase in the signal level, but must respond only very slowly to a decrease in the signal level. Thus, once the gain is reduced, it can only be increased slowly.

This introduces another problem. If, for some reason, the laser scanning beam scans across something bright, such as a shiny bit of plastic or metal, the gain of the AGC circuit will be reduced to its minimum and it may take several seconds to recover. The scanner is temporarily blinded.

The solution to this problem requires that the AGC circuit has advance knowledge about how large a signal it will be receiving so that it can adjust its gain before receiving the signal. It is, therefore, desirable to have an AGC circuit with this capability.

DISCLOSURE OF THE INVENTION

It is an object of the present invention to provide an automatic gain control circuit for anticipating the receipt of signals representing the start of a bar code.

It is another object of the present invention to cause the signals representing a bar code to have a predetermined amplitude before they are transmitted to a bar code reader for interpretation.

In one aspect, the invention is an anticipatory automatic gain circuit for anticipating a gain. The gain is that required to amplify a pulsed input signal having an amplitude which varies between input minimum and maximum values and to produce an output signal having an amplitude between predetermined minimum and maximum values. The amplitude of the output signal corresponds to the amplitude of the pulsed input signal. The anticipatory automatic gain circuit comprises means for producing a delayed pulsed input signal having an amplitude which varies between the input minimum and maximum values. It also comprises means for comparing the amplitude of the input and delayed input signals and producing a peak detection signal which represents the amplitude of the input and delayed input signals, whichever is greater. Further, the circuit comprises first and second variable-gain amplifier means and automatic gain control detector means. The first variable gain amplifier means amplifies the peak detection signal to produce an amplified peak detection signal in response to a control signal. The automatic gain control detector means detects the amplitude of the amplified peak detection signal and produces the control signal. The second variable gain amplifier means amplifies the delayed pulsed input signal to produce the output signal in response to the control signal.

BEST MODES FOR CARRYING OUT THE INVENTION

This invention is based on the premises that it is not necessary to predict the future in order to produce an anticipatory AGC circuit. Remembering the past is equally effective.

Figure 1:
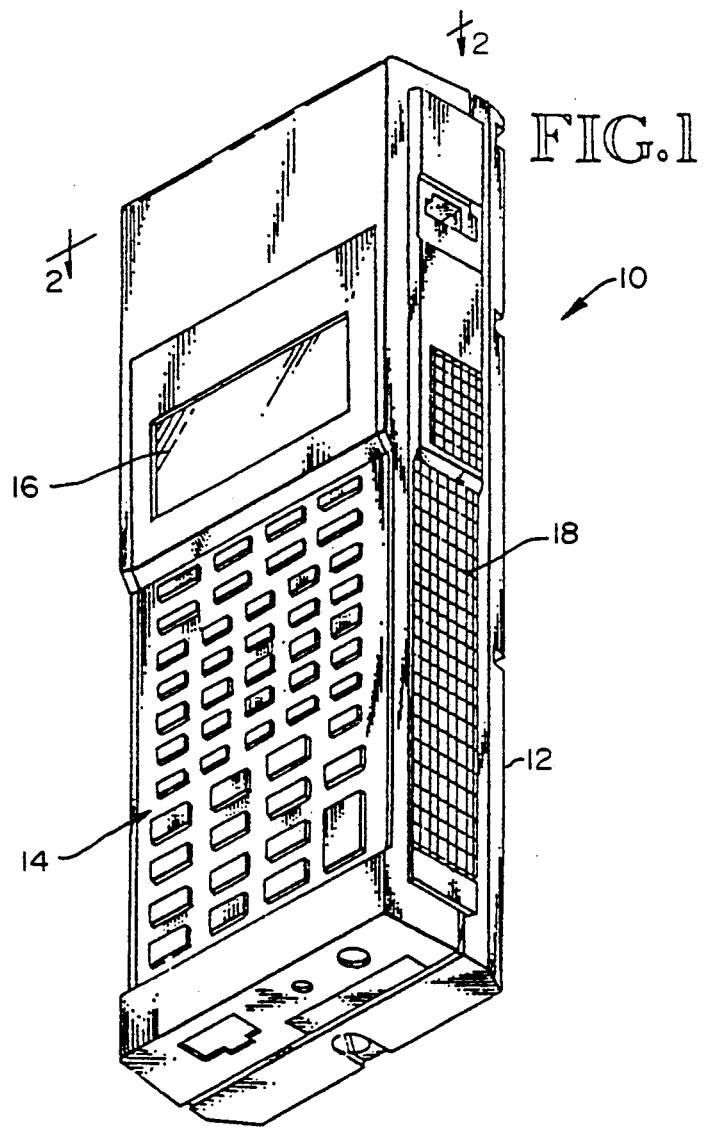
FIG. 1 is a perspective diagram of a scanning laser bar code reader.
Figure 2:
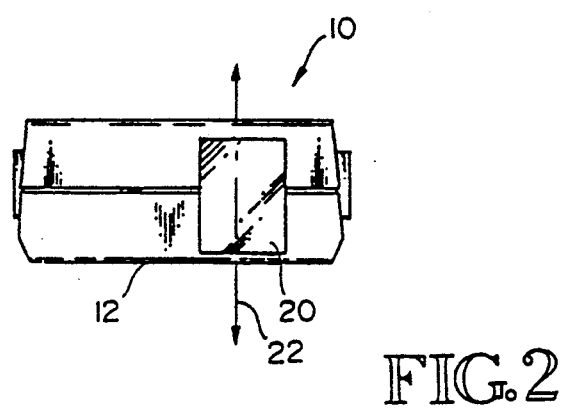
FIG. 2 is an end-on view of the top end of the scanning laser bar code reader shown in FIG. 1.

One embodiment of a laser scanner of the type with which the inventive circuit is intended to operate is shown in FIGS. 1 and 2. FIG. 1 is a perspective diagram of the laser scanner. FIG. 2 is an end-on view of the top end of the laser scanner shown in FIG. 1. The laser scanner 10 contains electronic circuitry and optical components contained within a case 12. It includes a keyboard 14 and liquid crystal display (LCD) 16 for the display of bar codes which have been read by the laser scanner 10 as well as for programming a microprocessor (not shown) contained within the laser scanner 10.

Upon actuating a pair of opposed trigger switches 18 (one shown in FIG. 1; also see FIG. 3B), the laser scanner 10 is activated to produce a scanning beam (not shown) of laser light. The scanning beam passes through the window 20 placed in the top end of the laser scanner 10, as shown in FIG. 2. The scanning occurs in the plane 22 (shown in FIG. 2). The light from the scanning beam is projected forwardly of the laser scanner 10. If it reaches a surface, some of the impinging energy returns to the window 20. If the reflecting surface happens to contain bar code symbology which the scanning laser beam impinges upon, the returning light will be modulated by the pattern of reflectivities which the bar code symbology contains. The light received by the laser scanner 10, if it is reflected from a bar code symbology, can be amplified and processed by circuitry that will be described in greater detail subsequently.

The wavelength of the light beam of laser light produced within the laser scanner 10 is determined by the laser light source which is contained in the laser scanner 10. The laser light source can produce a wavelength beyond the range of human vision ("invisible") or a wavelength within the range of human vision ("visible"). If an invisible laser beam is used to read the bar code symbology, it will generally be necessary to include an auxiliary light beam to be used by the operator of the laser scanner 10 to place the scanning beam on the bar code symbology.

Figure 3A:
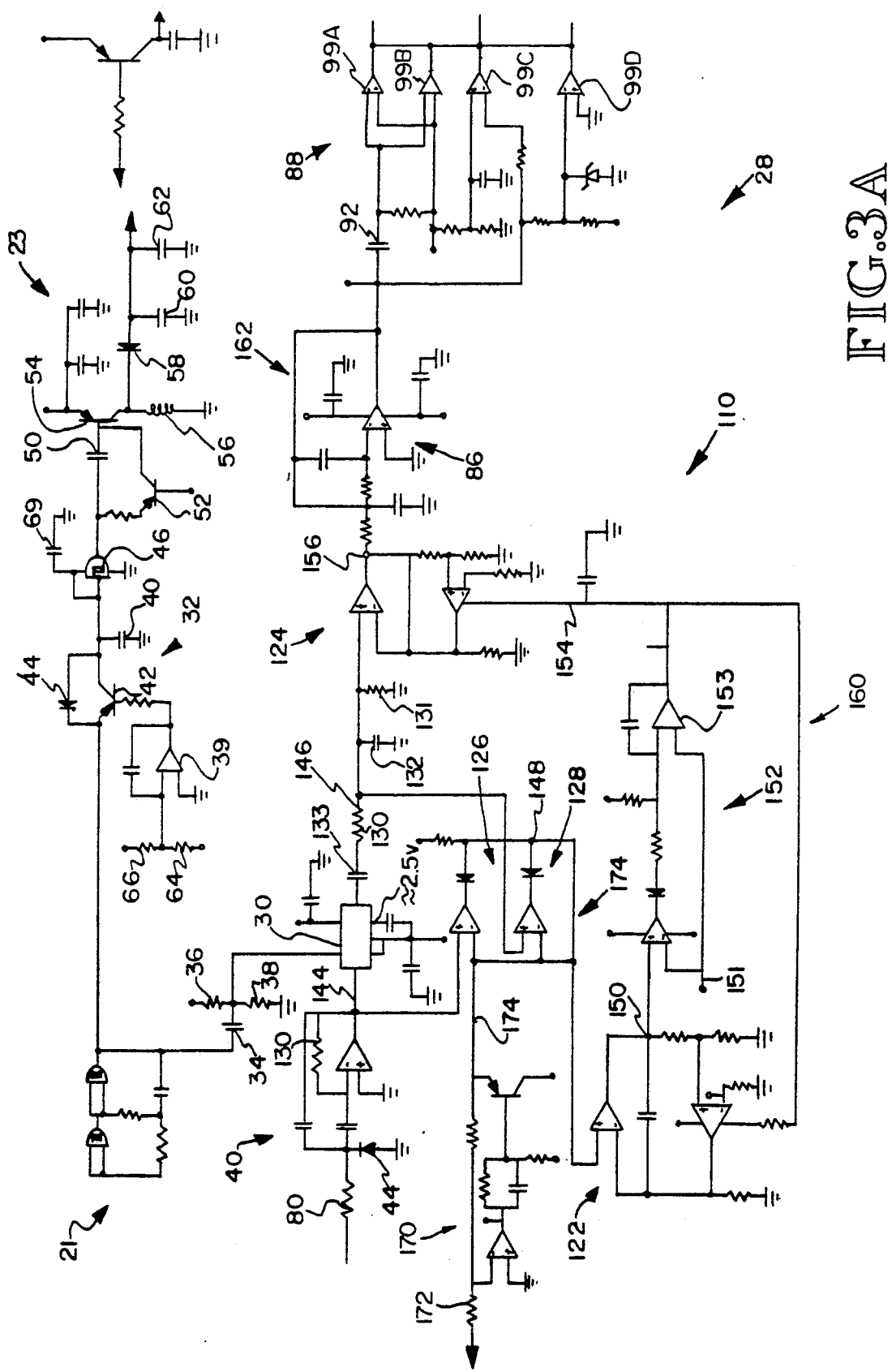
FIG. 3A is a first part of a schematic diagram of signal conditioning circuitry for a scanning laser bar code reader, including an anticipatory gain circuit.
Figure 3B:
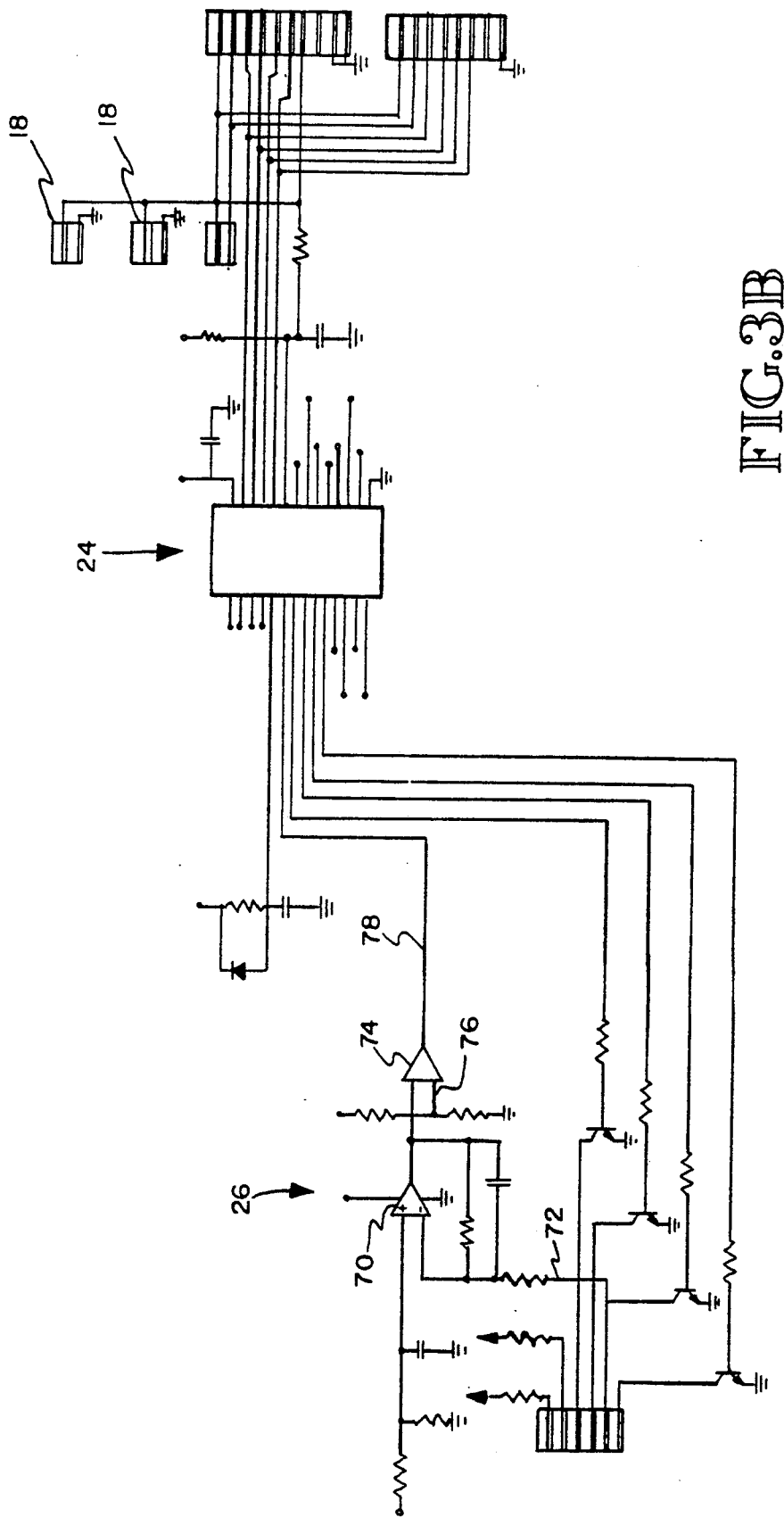
FIG. 3B is a second part of a schematic diagram of signal conditioning circuitry for a scanning laser bar code reader.

FIGS. 3A and 3B are first and second parts of a schematic diagram of signal conditioning circuitry for a scanning laser bar code reader, including an anticipatory gain circuit. The circuitry shown in the schematic diagrams of FIGS. 3A and 3B contain a 500 kHz clock 21, a power supply 23, control logic 24, a motor motion detector circuit 26, and a waveshaper 28.

The 500 kHz clock 21 is a simple CMOS gate-type oscillator. Its output drives an analog time delay element 30 (to be discussed subsequently) and a −5 volt power supply inverter 32. Both are driven by the same clock so that any clock-frequency noise coupled into the time circuitry ahead of the analog delay element 30 will by synchronously sampled within the time delay element 30 and converted to a DC offset at its output. The DC offset, accordingly, can be ignored.

The time delay element 30 requires that the clock which drives it be centered approximately 2.5 volts above the supply voltage Vss. Capacitor 34 and resistors 36 and 38 provide the level-shifting function.

When the laser scanner is not in use, only the control logic 24 is powered. The remainder of the circuitry is only powered up after the trigger switches 18 are actuated. The wave shaper and other circuitry requires a −5 volt power supply. It is important that this supply have good efficiency and low noise, as well as using as few components as possible. The −5 volt power supply used is designed to maintain regulation over a load range of 5 to 40 mA. The typical load on the −5 volt power supply is 15 mA.

The −5 volt power supply contains a pulse-width modulator derived from the 500 kHz clock, a high-speed switch, an output filter, and an error amplifier 39.

Circuitry in the power supply 23 generates a ramp waveform from the square 500 kHz clock. The ramp has a slow positive-going edge, whose rise rate depends on the output of the error amplifier 39. The fall time of the ramp is independent of the control signal. This is readily understood by observing that capacitor 40 is charged through transistor 42, which acts as a controlled current source, and is discharged through diode 44.

When the ramp waveform exceeds the threshold of Schmidt trigger logic gate 46, its output goes low, drawing a large pulse of current through capacitor 50, and simultaneously turning on transistor 52, which acts as a constant current source. The initial pulse through the capacitor turns on transistor 54 hard and fast for good efficiency; then the current source incorporating transistor 52 takes over, providing the drive current necessary to keep transistor 54 in saturation.

On the other half of the cycle, when the output of the Schmidt trigger logic gate 46 goes high, transistor 52 turns off, being reverse-biased by 2.5 volts, and capacitor 50 raises the base voltage of transistor 54 to +10 volts. This 5 volt reverse bias rapidly eliminates the charge stored in transistor 54's base, turning it off as fast as possible. Since little current flows in either the base of transistor 54 or the collector of transistor 52 during this part of the cycle, the voltage across capacitor 50 does not change appreciably during this time.

When transistor 54 is on, 5 volts are applied across inductor 56. This causes the current in inductor 56 to increase from 0 amperes to a value dependent upon how long transistor 54 is left on. When transistor 54 turns off, the current in inductor 56 cannot rapidly return to 0, but rather it keeps flowing in the same direction as it did when transistor 54 was on, but now it must flow through diode 58, a fast, low-loss Schottky diode, charging capacitors 60 and 62 to a negative voltage. If for some reason transistor 54 is on continuously, the current will increase to the point that either transistor 54 or inductor 56 will burn up.

The error amplifier 39 compares the −5 volt output (via resistor 64) to the +2.5 volt reference (via resistor 66), integrating the result with capacitor 68 and applying the error signal to the pulse-width modulator previously described, thus regulating the output voltage.

In order to prevent hazardous overexposure to the scanning laser beam in the event that the motor stops moving for any reason, the motor motion detector circuit 26 has been incorporated. The operational amplifier 70 in that circuit monitors the voltage across one of the motor windings (on line 72). The operational amplifier 74 compares that to a fixed reference level (on line 76). The control logic 24 only samples the comparator output 78 during the time when the monitored winding is not being driven.

If the motor is moving, there will still be a voltage across that winding, which is induced by the motion of the magnetized armature near it. If, however, the motor is stopped, even if it is mechanically jammed but still being driven, there will be no voltage across that unenergized winding. The control logic 24 will sense the lack of voltage and turn off the laser.

The waveshaper 28 is intended to convert the analog waveform representing the light intensity scattered from the bar code as it is scanned by the laser beam into a digital waveform representing as accurately as possible the actual bar space of the bar code.

Diode 84 clamps the large spikes which result from a direct reflection of the laser beam off a shiny surface and into the detector. This prevents saturation and slow recovery of anticipatory AGC circuit 110.

The waveshaper 28 shown in FIGS. 3A and 3B is of the type known as a double differentiator. It detects bar code edges based on points where the second derivative of the input signal is zero. It is called a double differentiator because it finds changes in concavity of steep sections of the input signal 80. In other words, the waveshaper 28 finds places where the second derivative of the input signal is zero (signal slope is unchanging) while the first derivative is large (slope is steep).

The circuit 82 between the input signal 80 and the time delay element 30 is a combination differentiator, amplifier, and low-pass filter. Its response characteristic has one zero at 0 Hz and one complex pole pair at 40 kHz. Thus circuit 82 behaves as a differentiator for moderate frequencies, but rapidly rolls off at frequencies above those present in a bar code. In a double differentiator circuit, it is necessary to remove all high frequency components above the band of interest or they will be greatly exaggerated by the differentiator's high-pass characteristic. The AGC circuit described below is not limited to use with a double differentiator or any other specific kind of waveshaper 28. In fact, although it is discussed in the context of a laser scanner, the AGC circuit of the invention need not be limited to use with a bar code scanner.

The new anticipatory AGC circuit 110 (see FIG. 3A) has several distinct advantages over the fast-attack, slow-release type used in the prior art. It preserves the sanctity of the quiet zone by reducing the gain well ahead of the arrival of the bar code signal. It is immune to being blinded by bright reflections. So long as the reflection occurs away from the actual bar code, there will be no recovery period. Within the bar code, it presents a smoother gain variation characteristic than AGC circuits in the prior art, causing less signal distortion.

The main elements in this circuit are the time delay element 30, a matched pair of variable-gain amplifiers 122 and 124, a pair of precision rectifiers 126 and 128, and an AGC detector/comparator/integrator circuit.

The operation of the anticipatory AGC circuit 110 is as follows:

The input signal 80 is applied to the input of the time delay element 30. In this implementation, the time delay element 30 is a bucket brigade device. However, there are other types of delay elements, such as SAW devices, transmission lines and magnetic tape loops, which could also be used. In this implementation, the delay is 2 milliseconds. A suitable clock for use with this time delay element operates at a rate of 500 kHz. The 500 kHz clock 21 is divided by two internally, so the total delay time is 512/(500/2)=approximately 2 ms. A band-pass filter consisting of resistors 130 and 131 and capacitors 132 and 133 filters out any fast variations in the output of the time delay element 30 as well as the DC offset component of the signal.

The pair of precision rectifiers 126 and 128 is connected to the time delay element 30, one to the input 144 and one to the output 146 of the time delay element 30. The rectifiers' outputs are tied together at point 148 to produce a signal which measures the larger of the two signals. This envelope signal at point 148 includes the envelope of the delayed signal, but combines it with the envelope of the original signal as well. Put another way, the envelope signal at output 148 anticipates the signal at output 146 by 2 milliseconds.

The envelope signal at point 148 is amplified by amplifier 122, one of the two variable-gain amplifiers. The peak of the output of that amplifier (at point 150) is compared to a reference voltage 151 in the AGC detector circuit 152. If it exceeds the reference, a control signal 154 is generated via a high gain integrator 153. This control signal is transmitted to the variable-gain amplifier 124, where it reduces the gain until the amplitude of the amplified signal is equal to the reference voltage 151.

Each variable-gain amplifier 122 and 124 contains an op-amp connected as a non-inverting amplifier where the feedback resistor has been replaced by a transconductance amplifier. The transconductance amplifier is an integrated circuit whose output current is equal to its differential input voltage multiplied by a transconductance which is proportional to a control current.

In this inventive anticipatory AGC circuit, the output of the variable-gain amplifier 122 (at point 150) is used only for comparison to the reference voltage 151. The second variable-gain amplifier 124 is connected to the output of the time delay element 30.

The control voltage 154 is applied to the second variable-gain amplifier 124 as well as the first variable-gain amplifier 122. Since the control voltage 154 is identical, and the variable-gain amplifiers 122 and 124 are identical, the gain of the second variable-gain amplifier 124 is the same as that of the first variable-gain amplifier 122. Accordingly, the amplitude of the output signal 156 will also equal the reference voltage 151 even though there is no feedback around the second variable-gain amplifier 124 to force its output to equal the reference voltage 151.

In operation, the first variable-gain amplifier 122 and AGC loop 160 looking at the envelope signal at point 148 will force the gain down as soon as a large signal enters the time delay element 30. The gain of the second variable-gain amplifier 124 will be reduced at the same time as the first variable-gain amplifier 122. However, that is 2 milliseconds before the signal at output 146 comes out of the time delay element 30. Hence, the anticipatory AGC circuit 110 has anticipated a coming change in input signal level and adjusted its gain in advance.

The anticipatory AGC circuit 110 also includes filtering. The gain control input 154 to the second variable-gain amplifier 124 is low-pass filtered. This is done because the AGC loop around the first variable-gain amplifier 122 has a fast attack time, resulting in a somewhat jagged control voltage 154. The low-pass filter on the gain control input of the second variable-gain amplifier 124 smooths out the jaggedness, reducing AGC-induced distortion of the output signal 156.

The other filtering in the anticipatory AGC circuit 110, such as low pass filter 162, is to eliminate signals outside of the frequencies corresponding to the bar code, stabilize the variable-gain amplifiers, and reduce the noise generated by the sample-data nature of the delay line.

The output of the second variable-gain amplifier 124 is passed through an inverted low-pass filter 86. The filter output represents the final "cleaned up" version of the first derivative of the analog signal. An edge detector 88 uses two sets of comparators 90A-D with their open-collector outputs wire-ANDed together, driving a set-reset flip-flop (not shown) to determine the bar/space transitions.

Capacitor 92 and resistor 94 form the second differentiator. Their output is compared to zero by the upper two comparators 90A and 90B. The output of comparator 90A goes high if the second derivative is negative. The output of the comparator 90B goes high if the second derivative is positive. The second derivative zero level is offset to +2.5 volts to allow the comparators 90A and 90B to run on a single-ended +5 volt supply.

The lower two comparators 90C and 90D determine whether the first derivative signal is large enough to enable the transitions detected by the second derivative comparators 90A and 90B. For positive first derivative levels, the signal is compared directly to a DC voltage generated from the +2.5 volt reference via a voltage divider. For negative first derivative levels, the single-ended comparator power supply requires that the signal level be offset in a positive direction such that 0 volt represents the allowable threshold level.

The anticipatory AGC circuit 110 also incorporates provision for limiting the maximum achievable gain. It does this by adding a third precision rectifier 170, connected to a fixed voltage 172, to the envelope detector section by connecting its output 174 to the point 148 which is input to the first variable-gain amplifier 122. Thus, the envelope output at point 148 is always the larger of either the voltage on the input 144 of the time delay element 30, the voltage on the output 146 of the time delay element 30, or the fixed DC gain-limiting voltage. Thus, even when no signal is present, the voltage 174 presents a non-zero output at point 148 to the first variable-gain amplifier 122, causing the AGC loop to increase the gain only to the point that the output of the first variable-gain amplifier 122 is equal to the reference voltage 151.

While the detailed description above has been expressed in terms of a specific example, those skilled in the art will appreciate that many other circuits could be used to accomplish the purpose of the disclosed inventive apparatus. Accordingly, it can be appreciated that various modifications of the above-described embodiments may be made without departing from the spirit and the scope of the invention. Therefore, the spirit and the scope of the present invention are to be limited only by the following claims.

I claim:

1. An anticipatory automatic gain control circuit for anticipating the gain required to amplify a pulsed input signal having an amplitude which varies between input minimum and maximum values and to produce an output signal having an amplitude corresponding to the amplitude of the pulsed input signal; comprising:

means for producing a delayed pulsed input signal having an amplitude which varies between the input minimum and maximum values;

means for comparing the amplitudes of the input and delayed input signals and producing a peak detection signal which represents the amplitude of the input signal or delayed input signal, whichever is greater;

first variable gain amplifier means for amplifying the peak detection signal in response to a control signal to produce an amplified peak detection signal having a desired amplitude;

automatic gain control detector means for detecting the amplitude of the amplified peak detection signal and producing the control signal so as to control the gain of the first amplifier means to produce the amplified peak detection signal at the desired amplitude; and second variable gain amplifier means for amplifying the delayed pulsed input signal in response to the control signal to produce the output signal.

2. The anticipatory automatic gain circuit of claim 1, further comprising means for producing a gain limiter signal and wherein the means for comparing the amplitudes further compares the amplitude of the gain limiter signal with the amplitudes of the input signal and delayed input signal, and produces the peak detection signal which represents the amplitude of the gain limiter signal, the input signal or the delayed input signal, whichever is greatest.

3. An anticipatory automatic gain control circuit for anticipating the gain required to amplify a pulsed input signal having an amplitude which varies between input minimum and maximum values and to produce an output signal having an amplitude corresponding to the amplitude of the pulsed input signal, comprising:

means for producing a delayed pulsed input signal having an amplitude which varies between the input minimum and maximum values;

means for producing a gain limiter signal;

means for comparing the amplitudes of gain limiter signal, the input signal, and the delayed input signal and producing a peak detection signal which represents the amplitude of the gain limiter signal, the input signal, or the delayed input signal, whichever is greatest;

first variable gain amplifier means for amplifying the peak detection signal in response to a control signal to produce an amplified peak detection signal having a desired amplitude;

automatic gain control detector means for detecting the amplitude of the amplified peak detection signal and producing the control signal so as to control the gain of the first amplifier means to produce the amplified peak detection signal at the desired amplitude; and second variable gain amplifier means for amplifying the delayed pulsed input signal in response to the control signal to produce the output signal.

4. An anticipatory automatic gain control circuit for anticipating the gain required to amplify a pulsed input signal having an amplitude which varies between input minimum and maximum values and to produce an output signal having an amplitude corresponding to the amplitude of the pulsed input signal, comprising:

a delay element producing a delayed pulsed input signal having an amplitude which varies between the input minimum and maximum values;

a comparator comparing the amplitudes of the input and delayed input signals and producing a peak detection signal which represents the amplitude of the input signal or delayed input signal, whichever is greater;

a first variable gain amplifier that receives the peak detection signal in response to a control signal and produces an amplified peak detection signal having a desired amplitude;

an automatic gain control detector detecting the amplitude of the amplified peak detection signal and producing the control signal so as to control the gain of the first amplifier to produce the amplified peak detection signal at the desired amplitude; and a second variable gain amplifier amplifying the delayed pulsed input signal in response to the control signal and producing the output signal.

5. The anticipatory automatic gain control circuit of claim 4, further comprising a gain limiter signal generator producing a gain limiter signal and wherein the first variable gain amplifier further compares the amplitude of the gain limiter signal with the amplitudes of the input signal and delayed input signal, and produces the peak detection signal which represents the amplitude of the gain limiter signal, input signal, or the delayed input signals, whichever is greatest.

* * * * *